United States Patent
Tanaka et al.

(10) Patent No.: US 6,673,441 B1
(45) Date of Patent: Jan. 6, 2004

(54) ADHESIVE, ADHESIVE MEMBER, INTERCONNECTING SUBSTRATE FOR SEMICONDUCTOR MOUNTING HAVING ADHESIVE MEMBER, AND SEMICONDUCTOR DEVICE CONTAINING THE SAME

(75) Inventors: Yuko Tanaka, Shimotsuma (JP); Yasushi Shimada, Tsukuba (JP); Teiichi Inada, Tsukuba (JP); Hiroyuki Kuriya, Shimodate (JP); Kazunori Yamamoto, Tsukuba (JP); Yasushi Kumashiro, Shimodate (JP); Keiji Sumiya, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/979,979

(22) PCT Filed: Jun. 15, 2000

(86) PCT No.: PCT/JP00/03908
§ 371 (c)(1),
(2), (4) Date: Nov. 29, 2001

(87) PCT Pub. No.: WO00/78887
PCT Pub. Date: Dec. 28, 2000

(30) Foreign Application Priority Data

Jun. 18, 1999 (JP) ............................................. 11-172815
Nov. 29, 1999 (JP) ............................................. 11-337878

(51) Int. Cl.⁷ ............................................. B32B 27/38
(52) U.S. Cl. ........................ 428/355; 428/413; 428/901; 525/107; 525/119; 528/271; 528/297
(58) Field of Search ........................... 428/355 EP, 413, 428/901; 525/107, 119; 528/271, 297

(56) References Cited

U.S. PATENT DOCUMENTS 5,021,519 A * 6/1991 Varde et al. ................. 525/423
5,708,056 A   1/1998 Lindley et al.
5,965,269 A * 10/1999 Inada et al. ................. 428/413

FOREIGN PATENT DOCUMENTS

WO   WO 98/20542   5/1998

OTHER PUBLICATIONS

Internet site www.plastics.about.com/library/glossary/b/bldef–b815.htm.*
Supplementary European Search Report.

* cited by examiner

*Primary Examiner*—Robert Dawson
*Assistant Examiner*—Christopher M Keehan
(74) *Attorney, Agent, or Firm*—Antonelli, Terry, Stout & Kraus, LLP (57) ABSTRACT

An adhesive which comprises (1) 100 parts by weight of an epoxy resin and a hardener therefor, (2) 75 to 300 parts by weight of an epoxidized acrylic copolymer having a glycidyl (meth)acrylate unit content of 0.5 to 6 wt. %, a glass transition temperature of −10° C. or higher and a weight average molecular weight of 100,000 or more and (3) 0.1 to 20 parts by weight of a latent curing accelerator; an adhesive member having a layer of the adhesive; an interconnecting substrate for semiconductor mounting having the adhesive member; and a semiconductor device containing the same.

23 Claims, 2 Drawing Sheets

ADHESIVE, ADHESIVE MEMBER, INTERCONNECTING SUBSTRATE FOR SEMICONDUCTOR MOUNTING HAVING ADHESIVE MEMBER, AND SEMICONDUCTOR DEVICE CONTAINING THE SAME

TECHNICAL FIELD

The present invention relates to an adhesive, an adhesive member, an interconnecting substrate for semiconductor mounting having the adhesive member, and a semiconductor device comprising a semiconductor chip and an interconnecting substrate bonded together by using the adhesive member.

BACKGROUND ART

With the progress of electronic and electric equipment in recent years, the mounting density of electronic parts has been increased, and new packaging methods have becoming to be used, such as so-called chip scale packages or chip size packages (hereinafter, they will be referred to as CSP) with sizes nearly equal to semiconductor chips, and bare chip packaging.

Reliability is one of the most important characteristics requisite for packaging substrates mounted with various electronic parts, such as semiconductor elements. Particularly, connection reliability against thermal fatigue is very important because it directly affects the equipment containing the packaging substrates.

One of the causes for the lowering of connection reliability is the thermal stress due to the use of various materials having different coefficients of thermal expansion. That is, semiconductor chips have coefficients of thermal expansion of as small as about 4 ppm/° C. while wiring boards for mounting electronic parts have coefficients of thermal expansion of as large as 15 ppm/° C. or more, so that thermal shock results in thermal strain, which results in a thermal stress.

In conventional substrates mounted with semiconductor packages containing lead frames, such as QFP or SOP, the deformation of lead frames absorbs the thermal stress to keep reliability.

In bare chip packaging wherein the electrodes of semiconductor chips and the wiring pads of wiring boards are connected by solder balls or by a conductive paste through small projections referred to as bumps, thermal stress concentrates to the connecting regions, to lower connecting reliability. Putting a resin referred to as "under fill" between chips and wiring boards is known to effectively disperse the thermal stress, but increases packaging steps and cost. Another method is connecting the electrodes of semiconductor chips and the wiring pads of wiring boards by conventional wire bonding, which, however, also increases the packaging steps because wires should be protected by coating a sealing resin.

Because CSP can be mounted together with other electronic parts, various structures have been proposed as disclosed in Surface Mounting Technique, 1997-3, "The future of CSP (fine pitch BGA) being put into practical use", p 5, Table 1, published by Nikkan Kogyo Shinbunsha. Among them, those containing a tape or carrier substrate as an interconnecting substrate called "interposer" have been increasingly put into practical use. In the above-described table, the structures developed by Tecera Co., Ltd. and TI Co., Ltd. correspond to the above-described structures. Because they contain an interconnecting substrate as an interposer, they excel in connection reliability as published in Shingaku Giho CPM96-121, ICD96-160 (1996-12), "Development of Tape/BGA-type CSP" and Sharp Giho, No. 66 (1996-12), "Chip Size Package Development".

Between the semiconductor chip and the interconnecting substrate called interposer contained in such a CSP is used an adhesive member that decreases the thermal stress resulting from their difference in coefficient of thermal expansion. The adhesive member requires moisture resistance and high temperature endurance, and there is a demand for film-form adhesive members, which facilitate the production process control.

Adhesives of the film type have been used in flexible printed wiring-boards, and most of them contain acrylonitrile butadiene rubber as a main component.

Among those for printed wiring boards that are improved in moisture resistance include an adhesive disclosed in Japanese Patent Application Unexamined Publication No. 60-243180 (1985) which contains an acrylic resin, an epoxy resin a polyisocyanate and an inorganic filler, and an adhesive disclosed in Japanese Patent Application Unexamined Publication No. 61-138680 (1986) which contains an acrylic resin, an epoxy resin, a compound having urethane bonds in molecules and terminated by a primary amine at each end and an inorganic filler.

The adhesive members as described above should release thermal stress and be heat and moisture resistant. In view of production processes, they also should neither allow an adhesive to flow out to electrode areas provided on semiconductor chips for electric signal output nor leave vacant spaces between them and circuits formed on interconnecting substrates. Flowing out of an adhesive to electrode areas causes connection defects of electrodes, and vacant spaces between a circuit and an adhesive tend to deteriorate heat resistance and moisture resistance. It is therefore important to control the flowing amount of adhesives. Further, film-form adhesives containing thermosetting resins are subject to change with passage of time, thereby decreasing the flowing amount and bonding strength. Adhesive members, therefore, require control of the flowing amount and bonding strength throughout their usable periods.

Film-form adhesives containing thermosetting resins gradually cure during storage. The adhesives further cure during various processes for producing a package, including mounting a semiconductor chip on an interconnecting substrate called interposer, fabrication of a package, etc. It is preferable to use an adhesive having a longer usable period to improve the processability of the adhesive and the connection reliability of semiconductor chips. That is, the longer the usable period is, the less the flowing amount and bonding strength decrease due to the change with passage of time, facilitating the control of the flowing amount and bonding strength.

The usable periods of conventional film-form adhesives could be increased by decreasing the content of the curing accelerator in an adhesive composition, but the curing rate was problematically lowered on curing the adhesives to cause foaming. There has been a demand for adhesives, which do not foam but have longer usable periods and as well satisfy the requirement for low elasticity, heat resistance and moisture resistance.

Further, adhesives for use in semiconductor packages or wiring generally contain thermosetting high molecular weight components such as epoxy resins to improve heat resistance. The thermosetting high molecular weight components, however, have the defects of requiring a high temperature and a long time for curing. To solve the defect, curing accelerators have been used together with the thermosetting resins. Blending a curing accelerator greatly improves the curability, but has caused another problem that the reaction proceeds even at room temperature, thereby changing the flowability of the adhesive during storage at room temperature to make the adhesive commercially useless. To solve the new problem, it was proposed to use a latent curing accelerator having no activity at room temperature. For example, Japanese Patent Application Unexamined Publication No. 9-302313 (1997) discloses the use of a very latent imidazole as a curing accelerator for epoxy resins in adhesive compositions. The latent curing accelerator improves storage stability. However, it has been found that because the production process of adhesive films includes a heat treatment step for curing the adhesive composition to B-stage and the partially reacted latent curing accelerator becomes active even at room temperature, the reaction gradually proceeds to deteriorate storage stability. This has caused a demand for further improvement of storage stability.

DISCLOSURE OF INVENTION

An object of the invention is to provide an adhesive and an adhesive member, which have a usable period of 3 months or more at 25° C. without deteriorating the low elasticity, heat resistance and moisture resistance necessary for mounting a semiconductor chip onto an interconnecting substrate, referred to as interposer, such as a glass-epoxy substrate or a flexible substrate, which are a largely different in coefficient of thermal expansion. Other objects of the invention is to provide an interconnecting substrate for semiconductor mounting having the adhesive member and to provide a semiconductor device wherein a semiconductor chip and an interconnecting substrate are bonded together by using the adhesive member.

Further, during the production of adhesive films, curing accelerators partially undergo reaction in the step of heat treatment at high temperatures in a coating drying furnace, so that the curing accelerators exhibit activity due to decomposition, etc., even during storage at room temperature, not excepting latent curing accelerators. It has been found that the crosslinking polymer component in the films is crosslinked due to its particularly high activity, thereby changing flowability largely and deteriorating storage stability. In view of this problem, another object of the invention is to provide an adhesive to be used for producing adhesive films particularly excelling in storage stability.

Accordingly, the present invention relates to the followings.

1) An adhesive (hereinafter, it may be referred to as adhesive A), comprising (1) 100 parts by weight of an epoxy resin and a hardener therefor, (2) 75 to 300 parts by weight of an epoxidized acrylic copolymer having a glycidyl (meth) acrylate unit content of 0.5 to 6 wt. %, a glass transition temperature Tg of −10° C. or higher and a weight average molecular weight of 100,000 or more and (3) 0.1 to 20 parts by weight of a latent curing accelerator.

2) An adhesive, comprising (1) 100 parts by weight of an epoxy resin and a hardener therefor, (2) 5 to 40 parts by weight of a high molecular weight resin being compatible with the epoxy resin and having a weight average molecular weight of 30,000 or more, (3) 75 to 300 parts by weight of an epoxidized acrylic copolymer having a glycidyl (meth) acrylate unit content of 0.5 to 6 wt. %, a glass transition temperature Tg of −10° C. or higher and a weight average molecular weight of 100,000 or more and (4) 0.1 to 20 parts by weight of a latent curing accelerator.

3) The adhesive of 1) or 2), wherein the latent curing accelerator is an adduct curing accelerator.

4) The adhesive of 3), wherein the latent curing accelerator is an amine adduct.

5) The adhesive of 4), wherein the latent curing accelerator is an amine-epoxy adduct.

6) The adhesive of any one of 1) to 5), which contains 1 to 20 parts by volume of an inorganic filler relative to 100 parts by volume of a resin content of the adhesive.

7) The adhesive of 6), wherein the inorganic filler is alumina, silica, aluminum hydroxide or antimony oxide.

8) The adhesive of any one of 1) to 7), which has generated 10 to 40% of heat to be generated by complete curing thereof as measured by DSC.

9) The adhesive of any one of 1) to 8), which has a residual solvent content of 5 wt. % or less.

10) The adhesive of any one of 1) to 9), which gives a cured product thereof having a storage modulus of 20 to 2,000 MPa at 25° C. and having a storage modulus of 3 to 50 MPa at 260° C. as measured by using a dynamic viscoelasticity measuring apparatus.

11) An adhesive (hereinafter, it may be referred to as adhesive B), which is an adhesive composition comprising two kinds of resins which when the composition is in a B-stage state, separate from each other into a disperse phase and a continuous phase, a hardener and a curing accelerator, wherein in the B-stage state, the curing accelerator is compatible with the disperse phase and separates from the continuous phase.

12) The adhesive of 11), wherein in the B-stage state, the disperse phase contains an epoxy resin and the curing agent as main components, and the continuous phase contains as a main component a high molecular weight component having a weight average molecular weight of 100,000 or more.

13) The adhesive of 12), wherein the high molecular weight component having a weight average molecular weight of 100,000 or more is an epoxidized acrylic copolymer having a glycidyl methacrylate unit content or a glycidyl acrylate unit content of 2 to 6 wt. %.

14) The adhesive of any one of 11) to 13), wherein the curing accelerator is an amine-epoxy adduct.

15) An adhesive member of a film form, comprising a carrier film and a layer of the adhesive of any one of 1) to 14) formed on the carrier film.

16) An adhesive member, comprising a core material and a layer of the adhesive of any one of 1) to 14) formed on each side of the core material.

17) The adhesive member of 16), wherein the core member is a heat resistant thermoplastic film.

18) The adhesive member of 17), wherein the heat resistant thermoplastic film has a softening temperature of 260° C. or higher.

19) The adhesive member of 17) or 18), wherein the core material or the heat resistant thermoplastic film is a porous film.

20) The adhesive member of any one of 17) to 19), wherein the heat resistant thermoplastic film is a liquid crystalline polymer.

21) The adhesive member of any one of 17) to 20), wherein the heat resistant thermoplastic film is a polyamideimide, a polyimide, a polyetherimide or a polyether sulfone.

22) The adhesive member of any one of 17) to 20), wherein the heat resistant thermoplastic film is a polytetrafluoroethylene, an ethylene-tetrafluoroethylene copolymer, a tetrafluoroethylene-hexafluoropropylene copolymer or a tetrafluoroethylene-perfluoroalkyl vinyl ether copolymer.

23) An interconnecting substrate for semiconductor mounting, comprising
- an interconnecting substrate having a semiconductor chip mounting surface and
- the adhesive member of any one of 15) to 22) stuck on the semiconductor chip-mounting surface of the interconnecting substrate.

24) A semiconductor device, comprising a semiconductor chip and an interconnecting substrate bonded together by using the adhesive member of any one of 15) to 22).

25) A semiconductor device, comprising an interconnecting substrate and a semiconductor chip having an area of 70% or more of an area of the interconnecting substrate, the interconnecting substrate and the semiconductor chip being bonded together by using the adhesive member of any one of 15) to 22).

BRIEF DESCRIPTION OF DRAWINGS

FIG. 1(*a*) is a sectional view of a film-form adhesive member of an embodiment according to the present invention, which consists of a single layer of an adhesive, and FIG. 1(*b*) is a sectional view of an adhesive member of an embodiment according to the present invention, which comprises a core material and an adhesive layer provided on each side of the core material.

FIG. 2(*a*) is a sectional view of an interconnecting substrate for semiconductor mounting, which has a film-form adhesive member of the present invention comprising a single layer of an adhesive, and FIG. 2(*b*) is a sectional view of an interconnecting substrate for semiconductor mounting, which has an adhesive member of the present invention comprising a core material and an adhesive layer provided on each side of the core material.

FIG. 3(*a*) is a sectional view of a semiconductor device wherein a semiconductor chip and an interconnecting substrate are bonded together by using a film-form adhesive member of the present invention comprising a single layer of an adhesive, and the pads on the semiconductor chip are connected to the interconnecting line on the substrate by bonding wires; FIG. 3(*b*) is a sectional view of a semiconductor device wherein a semiconductor chip and an interconnecting substrate are bonded together by using an adhesive member of the present invention comprising a core material and an adhesive layer provided on each side of the core material, and the pads on the semiconductor chip are connected to the interconnecting line on the substrate by bonding wires; FIG. 3(*c*) is a sectional view of a semiconductor device wherein a semiconductor chip and an interconnecting substrate are bonded together by using a film-form adhesive member of the present invention comprising a single layer of an adhesive, and the pads on the semiconductor chip are bonded to the inner leads of the substrate; and FIG. 3(*d*) is a sectional view of a semiconductor device wherein a semiconductor chip and an interconnecting substrate are bonded by using an adhesive member of the present invention comprising a core material and an adhesive layer provided on each side of the core material, and the pads on the semiconductor chip are bonded to the inner leads of the substrate.

EXPLANATION OF LETTERS 1. adhesive, 2. core material (heat resistant thermoplastic film), 3. interconnecting line, 4. interconnecting substrate, 5. semiconductor chip, 6. bonding wire, 6'. inner lead, 7. sealing material, 8. lead for external connection

BEST MODE FOR CARRYING OUT THE INVENTION

The epoxy resin contained in the adhesive A of the present invention may be any one which has bonding effect after curing and is difunctional or more, and preferably has a molecular weight or a weight average molecular weight of less than 5,000, for example not less than 300 and less than 5,000, more preferably less than 3,000. Examples of difunctional epoxy resins include bisphenol A epoxy resins and bisphenol F epoxy resins. Bisphenol A epoxy resins and Bisphenol F epoxy resins are marketed by Yuka Shell Epoxy Co., Ltd. under the trade names of EPKOTE 807, EPIKOTE 827 and EPIKOTE 828, by Dow Chemical Japan Co., Ltd. under the trade names of D.E.R. 330, D.E.R. 331 and D.E.R. 361, and by Tohto Kasei Co., Ltd. under the trade names of YD 8125 and YDF 8170.

To increase Tg, a polyfunctional epoxy resin may be added, such as a phenol novolac epoxy resin or a cresol novolac epoxy resin. Phenol novolac epoxy resins are marketed by Nippon Kayaku Co., Ltd. under the trade name of EPPN-201. Cresol novolac epoxy resins are marketed by Sumitomo Chemical Co., Ltd. under the trade names of ESCN-190 and ESCN-195, by Nippon Kayaku Co., Ltd. as mentioned above under the trade names of EOCN 1012, EOCN 1025 and EOCN 1027, and by Tohto Kasei Co., Ltd. under the trade names of YDCN 701, YDCN 702, YDCN 703 and YDCN 704.

The hardener for the epoxy resin may be any hardener commonly used for epoxy resins, and its examples include amines, polyamides, acid anhydrides, polysulfides, boron trifluoride and compounds having two or more phenolic hydroxyl groups per molecule, such as bisphenol A, bisphenol F and bisphenol S. Having good resistance to electrolytic corrosion on moisture absorption, phenol resins, such as phenol novolac resins, bisphenol novolac resins and cresol novolac resins, are preferred.

Among the preferred hardeners, phenol novolac resins are marketed by Dainippon Ink & Chemicals, Inc. under the trade names of BARCAM TD 2090, BARCAM TD 2131 and PLYORPHEN LF 2882, bisphenol novolac resins are marketed by Dainippon Ink & Chemicals, Inc. under the trade names of PHENOLITE LF 2882, PHENOLITE LF 2822, PHENOLITE TD-2090, PHENOLITE TD-2149, PHENOLITE VH 4150 and PHENOLITE VH 4170. Preferred phenol novolac resins, bisphenol novolac resins and cresol novolac resins have a weight average molecular weight of 500 to 2,000, more preferably 700 to 1,400.

The amount of the hardener is preferably 0.6 to 1.4 equivalents, more preferably 0.8 to 1.2 equivalents of groups reactive with the epoxy groups of the epoxy resin per equivalent of the epoxy groups of the epoxy resin. Less or excessive hardener may deteriorate heat resistance.

Examples of the high molecular weight resins being compatible with the epoxy resin and having a weight average molecular weight of 30,000 or more include phenoxy resins, high molecular weight epoxy resins, ultra high molecular weight epoxy resins, rubbers having highly polar functional groups and reactive rubbers having highly polar functional groups. To make the adhesive less tacky in B-stage and more flexible after curing, the weight average molecular weight is 30,000 or more. The high molecular weight resin being compatible with the epoxy resin and having a weight average molecular weight of 30,000 or more preferably has a weight average molecular weight of 500,000 or less, more preferably 30,000 to 100,000. Resins having too large molecular weights lower the flowability. Examples of the reactive rubbers having highly polar functional groups include rubbers made by the addition of highly polar functional groups, such as carboxyl groups, to acrylic rubbers. Herein, the terms "being compatible with the epoxy resins" mean that it forms a uniform blend together with the epoxy resin after curing without separating into two or more phases. To prevent the phase containing the epoxy resin as a main component (hereinafter referred to as epoxy resin phase) from lacking flexibility, decrease in tackiness and decrease in insulation due to cracking or the like, the amount of the high molecular weight resin being compatible with the epoxy resin and having a weight average molecular weight of 30,000 or more is 5 parts by weight or more relative to 100 parts by weight of the total of the epoxy resin and the hardener, and 40 parts by weight or less to prevent decrease of the Tg of the epoxy resin phase, preferably 10 to 20 parts by weight.

Phenoxy resins are marketed by Tohto Kasei Co., Ltd. under the trade names of PHENOTOHTO YP-40 and PHNOTOHTO YP-50, by Phenoxy Associate under the trade names of PKHC, PKHH and PKHJ. The high molecular weight epoxy resins include high molecular weight epoxy resins having a molecular weight of 30,000 to 80,000 and ultra high molecular weight epoxy resins having a molecular weight of more than 80,000 (refer to Japanese Patent Examined Publication Nos. 7-59617 (1995), 7-59618 (1995), 7-59619 (1995), 7-59620 (1995), 7-64911 (1995) and 7-68327 (1995)), all are produced by Hitachi Chemical Co., Ltd.). As a reactive rubber having highly polar functional group, a carboxyl group-having acrylic rubber is marketed by Teikoku Kagaku Sangyo Co., Ltd. under the trade name of HTR-860P.

An example of usable epoxidized acrylic copolymer having a glycidyl (meth)acrylate unit content of 0.5 to 6 wt. %, a Tg of −10° C. or higher and a weight average molecular weight of 100,000 or more is HTR-860P-3 (trade name) marketed by Teikoku Kagaku Sangyo Co., Ltd. Functional monomers of carboxylic acid type, such as acrylic acid, and of hydroxyl group type, such as hydroxymethyl (meth) acrylate, are unsuitable because they promote crosslinking, thereby decreasing bonding strength due to gelation in a state of varnish and excessive curing in a B-stage state. The amount of glycidyl (meth)acrylate used as a functional monomer is 0.5 to 6 wt. % in copolymerization ratio. It is 0.5 wt. % or more to ensure heat resistance, and is 6 wt. % or less to decrease rubbers to be added and to increase the solid content of a varnish. In cases where it is more than 6 wt. %, a large amount of the epoxidized acrylic copolymer is necessary to lower the elastic modulus of cured adhesives. The epoxidized acrylic copolymer, having a high molecular weight, increases the viscosity of adhesive varnishes with the increase of its weight ratio. Varnishes of high viscosity are difficult to form into films and for this reason are diluted with a proper amount of a solvent to lower the viscosity. This results in the problems of decrease in the solid contents of the adhesive varnishes, increase in the production of adhesive varnishes and the lowering of the production efficiency. Examples of other units than the glycidyl (meth)acrylate units include those derived from alkyl acrylates or alkyl methacrylates both having an alkyl group of 1 to 8 carbon atoms, such as methyl acrylate and methyl methacrylate, or mixtures thereof with styrene or acrylonitrile. The mixing ratios thereof are selected in consideration of the Tg of the copolymer. The copolymer should have a Tg of −10° C. or higher because B-stage adhesive films formed by using a copolymer with a Tg of lower than −10° C. becomes too tacky to handle. The Tg is preferably 40° C. or lower, more preferably −10° C. to 20° C. If the Tg is too high, the film may be broken on handling at room temperature. Examples of polymerization methods include pearl polymerization and solution polymerization. Preferred copolymers are obtainable, for example, by copolymerizing (a) 18 to 40 wt. % of acrylonitrile, (b) 0.5 to 6 wt. % of glycidyl (meth) acrylate and (c) 54 to 80 wt. % of ethyl acrylate, ethyl methacrylate, butyl acrylate or butyl methacrylate.

The epoxidized acrylic copolymer has a weight average molecular weight of 100,000 or more, particularly preferably 800,000 or more. The reason is that such molecular weights cause not much decrease in the strength and flexibility of films and not much increase in tackiness. The weight average molecular weight of the epoxidized acrylic copolymer is preferably 2,000,000 or less because larger molecular weights lower flowability and make it difficult to fill wiring circuits.

The amount of the epoxidized acrylic copolymer preferably is 75 parts by weight or more relative to 100 parts by weight of the total of the epoxy resin and the hardener to lower the elastic modulus and the flowability during molding, and is 300 parts by weight or less because excessive epoxidized acrylic copolymer deteriorates processability at high temperatures due to increase in the rubber phase and decrease in the epoxy resin phase, and more preferably, it is 100 to 250 parts by weight.

The latent curing accelerator is a curing accelerator that can considerably lower the reaction rate of the adhesive at room temperature while keeping the reaction rate at curing temperatures, and is a solid insoluble in the epoxy resin at room temperature and is solubilized with heat to work as an accelerator. The latent curing accelerators usable in the present invention include conventional latent curing accelerators, and typical but non-limitative examples include dicyanodiamide, dihydrazides, such as adipic dihydrazide, guanamic acid, melamic acid, adducts of an epoxide and an imidazole, adducts of an epoxide and a dialkylamine, adducts of an amine and urea, thiourea or a derivative thereof (amine-ureido adduct latent curing accelerators) and adducts of an amine and an isocyanate (amine-urethane adduct latent curing accelerators). Preferred are those of adduct structures, which are less active at room temperature. Adduct structures are obtainable by the addition reaction of catalytically active compounds with other various compounds, and an adduct wherein the catalytically active compound is an amine, such as an imidazole or a compound having primary, secondary or tertiary amino group is referred to as an amine adduct. Examples of the amine adducts to which different compounds are added include amine-epoxy adducts, amine-ureido adducts and amine-urethane adducts. The most preferred are amine-epoxy adducts, which do not foam on curing, have lower elasticity and give a curing product of the adhesive having good heat resistance and moisture resistance. Those with long chain epoxides are particularly preferable because of their high latency.

The amine-epoxy adduct latent curing accelerators usable in the present invention are insoluble in the epoxy resin at room temperature and are solubilized with heat to work as accelerators, and are adducts obtainable by the reaction of an amine and an epoxide, and also include such adducts the surfaces of which are treated with an isocyanate or an acidic compound.

Non-limitative examples of the epoxides used for the production of the amine-epoxy adduct latent curing accelerators include polyglycidyl ethers obtainable by the reaction of a polyhydric phenol, such as bisphenol A, bisphenol F, catechol or resorcinol, or a polyhydric alcohol, such as glycerol or polyethylene glycol, with epichlorohydrin; glycidyl ether esters obtainable by the reaction of a hydroxycarboxylic acid, such as p-hydroxybenzoic acid or β-hydroxynaphthoic acid, with epichlorohydrin; polyglycidyl esters obtainable by the reaction of a polycarboxylic acid, such as phthalic acid or terephthalic acid, with epichlorohydrin; glycidyl amines obtainable, for example, by the reaction of 4,4'-diaminodiphenylmethane or m-aminophenol with epichlorohydrin; polyfunctional epoxides, such as epoxidized phenol novolac resins, epoxidized cresol novolac resins and epoxidized polyolefins; and monofunctional epoxides, such as butyl glycidyl ether, phenyl glycidyl ether and glycidyl methacrylate.

The amines used for the production of the amine-epoxy adduct latent curing accelerators may be any ones which has per molecule one or more active hydrogen addition-reactive with epoxy group and one or more substituent selected from primary amino group, secondary amino groups and tertiary amino groups. Non-limitative examples of the amines include aliphatic amines, such as diethylenetriamine, triethylenetetramine, n-propylamine, 2-hydroxyethylaminopropylamine, cyclohexylamine, 4,4'-diamino-dicyclohexylmethane; aromatic amines, such as 4,4'-diaminodiphenylmethane and 2-methylaniline; and nitrogen-containing heterocyclic compounds, such as 2-ethyl-4-methylimidazole, 2-methylimidazole, 2-ethyl-4-methylimidazoline, 2,4-dimethylimidazoline, piperidine and piperadine. Among these compounds, those having a tertiary amino group give curing accelerators with very high latency, and non-limitative examples of such compounds include amine compounds, such as dimethylaminopropylamine, diehtylaminopropylamine, di-n-propylaminopropylamine, dibutylaminopropylamine, dimethylaminoethylamine, diethylaminoethylamine and N-methylpiperadine; and primary or secondary amines having a tertiary amino group in molecule, for example imidazoles, such as 2-methylimidazole, 2-ethylimidazole, 2-ethyl-4-methylimidazole and 2-phenylimidazole.

The above-described amines are also usable for the production of the amine-ureido adduct latent curing accelerators and amine-urethane adduct latent curing accelerators.

Examples of the isocyanates used for the production of the amine-urethane adduct latent curing accelerators include polyisocyanates, such as tolylene diisocyanates, diphenylmethane diisocyanates, naphthylene diisocyanates, xylylene diisocyanates, diphenyl sulfone diisocyanates, triphenylmethane diisocyanates, hexamethylene diisocyanate, 3-isocyanatomethyl-3,5,5-trimethylcyclohexyl isocyanate, 3-isocyanatoethyl-3,5,5-trimethylcyclohexyl isocyanate, 3-isocyanatoethyl-3,5,5-triethylcyclohexyl isocyanate, diphenylpropane diisocyanates, phenylene diisocyanates, cyclohexylylene diisocyanates, 3,3'-diisocyanatodipropyl ether, triphenylmethane triisocyanates and diphenyl ether-4,4'-diisocyanate; dimers and trimers thereof; and adducts of these polyisocyanates with polyhydric alcohols, such as trimethyrolpropane and glycerol.

Typical but non-limitative examples of the adduct-type curing accelerators usable in the present invention are as follows. Examples of the amine-epoxy adducts are those marketed by Ajinomoto Co., Inc. under the trade names of AMICURE PN-23, AMICURE MY-24, AMICURE MY-D and AMICURE MY-H, by A. C. R. Co., Ltd. under the trade names of HARDENER X-3615S and HARDENER X-3293S, by Asahi Chemical Industry Co., Ltd. under the trade names of NOVACURE HX-3748 and NOVACURE HX-3088, by Pacific Anchor Chemical under the trade names of ANCAMINE 2014 AS and ANCAMINE 2014 FG. Examples of the amine-ureido adducts are those marketed by Fuji Kasei Co., Ltd. under the trade names of FUJICURE FXE-1000 and FUJICURE FXR-1030.

The amount of the latent curing accelerator is 0.1 to 20 parts by weight, preferably 1.0 to 15 parts by weight, relative to 100 parts by weight of the total of the epoxy resin and the hardener therefor, and if less than 0.1 part by weight, curing rate will be too low to form a good cured product of the adhesive, and if more than 20 parts by weight, the usable period will be problematically shortened.

The adhesive may contain a coupling agent to strengthen the interfacial bonding between different materials. Examples of coupling agents include silane coupling agents, titanate coupling agents and aluminum coupling agents, with silane coupling agents preferred.

Examples of the silane coupling agents include γ-glycidoxypropyltrimethoxysilane, γ-mercaptopropyltrimethoxysilane, γ-aminopropyltriethoxysilane, γ-ureidopropyltriethoxysilane and N-β-aminoethyl-γ-aminopropyltrimethoxysilane.

As to the above-described silane coupling agents, γ-glycidoxypropyltrimethoxysilane is marketed under the trade name of NUC A-187, γ-mercaptopropyltrimethoxysilane under the trade name of NUC A-189, γ-aminopropyltriethoxysilane under the trade name of NUC A-1100, γ-ureidopropyltriethoxysilane under the trade name of NUC A-1160 and N-β-aminoethyl-γ-aminopropyltrimethoxysilane under the trade name of NUC A-1120, all by Japan Unicar Co., Ltd.

In view of effects, heat resistance and cost, the amount of the coupling agent preferably is 0.1 to 10 parts by weight relative to 100 parts by weight of resins.

Ion trapping agents may be added to improve the insulation reliability on moisture absorption by adsorbing ionic impurities. In view of effects, heat resistance and cost, the amount of the ion trapping agents is preferably 1 to 10 parts by weight relative to 100 parts by weight of the epoxy resin and the hardener therefor. As the ion trapping agents, known anti-copper-pollution agents for preventing the elution of ionized copper, such as triazine thiol compounds and bisphenol reductants, may be added. Examples of the bisphenol reductants include 2,2'-methylene-bis-(4-methyl-6-tert-butyl phenol) and 4,4'-thio-bis-(3-methyl-6-tert-butylphenol). Inorganic ion adsorbents may also be used. Examples of the inorganic ion adsorbents include zirconium compounds, antimony-bismuth compounds and magnesium-aluminum compounds. An example of the anti-copper-hazard agents comprising triazine thiol compounds is JIS-NET DB (trade name) marketed by Sankyo Pharmaceutical Co., Ltd. An example of the anti-copper-pollution agents comprising bisphenol reductants is YOSHINOX BB (trade name) marketed by Yoshitomi Pharmaceutical Co., Ltd. Various inorganic ion adsorbents are marketed by Toagosei Chemical Co., Ltd. under the trade name of IXE.

The adhesive of the present invention preferably contains an inorganic filler for improving the processability and thermal conductivity of the adhesive, controlling the melt viscosity and giving thixotropy. Examples of inorganic fillers include aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, amorphous silica and antimony oxide. Alumina, aluminum nitride, boron nitride, crystalline silica and amorphous silica are suitable for improving thermal conductivity. Aluminum hydroxide, magnesium hydroxide, calcium carbonate, magnesium carbonate, calcium silicate, magnesium silicate, calcium oxide, magnesium oxide, alumina, crystalline silica and amorphous silica are suitable for controlling melt viscosity and giving thixotropy. Alumina, silica, aluminum hydroxide and antimony oxide are suitable for improving moisture resistance in addition to the above properties.

The content of the inorganic filler is preferably 1 to 20 parts by volume relative to 100 parts by volume of the resin content of the adhesive. The reason is that contents of 1 part by volume or more are preferable to make effects, and contents of 20 parts by volume or less are preferable to prevent the problems resulting from large contents, such as increase in the storage modulus of the adhesive, decrease in adhesion and deterioration in electrical properties due to voids.

We also have found that the storage stability of adhesives and adhesive films can be improved by selectively putting curing accelerators into a discontinuously dispersed resin phase. For this purpose, the adhesive B should be an adhesive composition comprising two kinds of resins separating into two phases in a B-stage state, a hardener and a curing accelerator, and the curing accelerator should be compatible with the disperse phase in a B-stage state and separates from the continuous phase.

Examples of the resins to be used to form the disperse phase include epoxy resins, cyanate ester resins, cyanate resins, silicone resins, acrylic rubbers having functional groups, such as epoxy groups or carboxyl groups, butadiene rubbers having functional groups, such as epoxy groups or carboxyl groups and modified resins, such as silicone-modified polyamide-imides. Epoxy resins are preferred for their high adhesion and good heat resistance. Usable epoxy resins are the same as those described above. Usable hardeners for epoxy resins are also the same as those described above. The amounts and ratios thereof are the same as those described above.

Examples of the resins which separate from the resin phase in a B-stage state include acrylic rubbers which are copolymers of an acrylic ester or methacrylic ester with acrylonitrile, butadiene rubbers containing styrene units or acrylonitrile units, silicone resins and modified resins, such as silicone-modified polyamide-imides. To form a film with good processability, it is preferable to use a high molecular weight component having a weight average molecular weight of 100,000 or more. To increase adhesion and heat resistance, it is particularly preferable to use an acrylic copolymer having a glycidyl methacrylate or glycidyl acrylate unit content of 2 to 6 wt. % and a Tg of −10° C. or higher and a weight average molecular weight of 100,000 or more (particularly preferably 800,000 or more and preferably 2,000,000 or less).

Among the acrylic copolymers exemplified for the adhesive A, those having a glycidyl (meth)acrylate unit content of 2 to 6 wt. % can be used as the acrylic copolymers having a glycidyl methacrylate or glycidyl acrylate unit content of 2 to 6 wt. % and a Tg of −10° C. or higher and a weight average molecular weight of 100,000 or more (particularly preferably 800,000 or more).

The resins for forming the resin phases should separate into separate phases in a B-stage state, and one resin has to form a discontinuous disperse phase, other resin a continuous phase. The B-stage state herein means a state wherein, as measured by using a DSC, 10 to 40% of heat to be generated by the complete curing of an uncured composition has been generated.

The preferred amount of the resin for forming a continuous phase in a B-stage state is generally 20 to 85 wt. % of the total of the resins forming the disperse phase and the continuous phase.

The curing accelerator should be compatible with the island-like disperse phase discontinuously dispersed in a B-stage state and separate from the sea-like phase. It preferably is, in polarity and molecular structure, similar to the island-like phase and largely different from the other phase. For example, in cases where the discontinuously dispersed island-like resin phase comprises an epoxy resin and a hardener as main components and the other phase is an acrylic rubber, the curing accelerator is preferably an adduct of an epoxide and an imidazole or an adduct of an epoxide and a dialkylamine. Particularly preferred are adducts of long chain epoxides. In view of low activity at room temperature, preferred are curing accelerators of adduct structures, such as amine-epoxy adducts, amine-ureido adducts and amine-urethane adducts. The most preferred are amine-epoxy adducts, which do not foam on curing, have lower elasticity and give a curing product of the adhesive having good heat resistance and moisture resistance.

Typical examples of the amine-epoxy adduct latent curing accelerators and other adduct curing accelerators are as exemplified above.

The amount of curing accelerators (including latent curing accelerators) is preferably 0.1 to 20 parts by weight, more preferably 1.0 to 15 parts by weight, relative to 100 parts by weight of the total of the resin and the hardener in the disperse phase. An amount of less than 0.1 part by weight may lower the curing rate, and that of more than 20 parts by weight may shorten the usable period.

Preferred curing accelerators are the adduct-type of latent curing accelerators as described above, and are preferably used in combination of imidazoles in proper ratios for keeping the desired storage stability.

Examples of the imidazoles include 2-methylimidazole, 2-ethyl-4-methylimidazole, 1-cyanoethyl-2-phenylimidazole and 1-cyanoethyl-2-phenylimidaolium trimellitate. Such imidazoles are marketed by Shikoku Kasei Kogyo Co., Ltd. under the trade names of 2E4MZ, 2PZ-CN and 2PZ-CSN.

Fillers may additionally be added to control the flowability and to improve moisture resistance. Examples of such fillers include silica and diantimony trioxide.

The adhesive may contain coupling agents to strengthen the interfacial bonding between different materials. Ion trapping agents may further be added to improve the insulation reliability on moisture absorption by adsorbing ionic impurities.

The amount of coupling agents preferably is 0.1 to 10 wt. % of the total of the resin components forming the disperse phase and the continuous phase, respectively, and the hardener component.

The amount of ion trapping agents preferably is 1 to 10 wt. % of the total of the resin components forming the disperse phase and the continuous phase, respectively, and the hardener component.

The effect of selectively putting the curing accelerator into the discontinuously dispersed resin phase is not clear, but is supposed as follows. Great part of the curing accelerator is contained in the island-like disperse phase, and the continuous phase contains little curing accelerator. The flowability is not affected very much by the curing proceeding in the disperse phase during storage, while, at curing temperatures, the continuous phase is presumed to undergo curing by the reaction thereof with the active groups resulting from the reaction that started in the disperse phase.

The film-form adhesive member of the present invention is obtainable by dissolving or dispersing the components of the adhesive in a solvent to form a varnish, which is applied to a carrier film and heated to remove the solvent, to form an adhesive layer on the carrier film. The heating temperature is preferably 100 to 180° C., more preferably 130 to 160° C., and the heating time is preferably 3 to 15 minutes, more preferably 4 to 10 minutes. It is preferable that the removal of the solvent by heating is carried out so that the adhesive is partially cured to generate 10 to 40% of the heat to be generated by complete curing thereof as measured by DSC (differential scanning thermal analysis). The resulting film-form adhesive preferably has a residual solvent content of 5 wt. % or less.

Examples of usable carrier films are plastic films, such as polytetrafluoroethylene films, polyethyleneterephthalate films, release-treated polyethyleneterephthalate films, polyethylene films, polypropylene films, polymethylpentene films and polyimide films. When the film-form adhesive member is used, the carrier film may be removed to use the adhesive film alone, or may be used together with the adhesive film and removed later.

As to Examples of the carrier films to be used in the present invention, polyimide films are marketed by Toray DuPont Co., Ltd. under the trade name of CAPTON, and by Kanegafuchi Chemical Industry Co., Ltd. under the trade name of APICAL. Polyethyleneterephthalate films are marketed by Toray DuPont Co., Ltd. under the trade name of RUMILAR, and by Teijin Ltd. under the trade name of PULEX.

The varnish preferably is prepared by using a solvent of a relatively low boiling point, such as methyl ethyl ketone, acetone, methyl isobutyl ketone, 2-ethoxyethanol, toluene, butyl cellosolve, methanol, ethanol or 2-methoxyethanol. Solvents of high boiling points may be added to improve the coating properties. Examples of solvents of high boiling points include dimethylacetamide, dimethylformamide, methylpyrrolidone and cyclohexanone.

To disperse a inorganic filler, the varnish can be prepared by using a mixing and kneading machine, a triple roll, a bead mill or a combination thereof. The mixing time can be shortened by mixing a filler with low molecular weight components and then mixing thereto high molecular weight components. After preparation, the varnish preferably is degassed under vacuum to remove bubbles.

The thickness of the adhesive member consisting of a film-form adhesive is not limited but preferably is 25 to 250 $\mu$m. Adhesive members thinner than 25 $\mu$m cannot release stress effectively, and thick ones are not economical.

Two or more adhesive films may be stuck together to obtain an adhesive member of the desired thickness. In such a case, the adhesive films should be stuck so as not to be peeled off from each other.

The adhesive member of the present invention may comprise a core material and an adhesive layer formed on each side of the core material. The thickness of the core material is not limited but preferably is 5 to 200 $\mu$m. The thickness of each adhesive layer formed on each side of the core material is not limited but preferably is 10 to 200 $\mu$m. Adhesive layers thinner than the range cannot release stress effectively, and thicker ones are not economical.

The core material to be used in the present invention preferably is a heat resistant thermoplastic film made of a heat resistant polymer, a liquid crystalline polymer or a fluorinated polymer, and preferred examples are polyamideimides, polyimides, polyether imides, polyether sulfones, aromatic polyesters, polytetrafluoroethylenes, ethylene tetrafluoroethylene copolymers, tetrafluoroethylene-hexafluoropropylene copolymers and tetrafluoroethylene-perfluoroalkyl vinyl ether copolymers. The core material may also be a porous film for lowering the elastic modulus of the adhesive member. The core material preferably has a softening temperature of 260° C. or higher. In cases where the core material is a thermoplastic film with a softening temperature of lower than 260° C., it may be peeled off from the adhesive at high temperatures on solder reflow or the like.

Polyimide films are marketed by Ube Industries, Ltd. under the trade name of UPILEX, by Toray DuPont Co., Ltd. under the trade name of CAPTON, and by Kanegafuchi Chemical Industry Co., Ltd. under the trade name of APICAL. Polytetrafluoroethylene films are marketed by Mitsui.DuPont Fluorochemicals Co., Ltd. under the trade name of TEFLON, and by Daikin Industries, Ltd. under the trade name of POLYFLON. Ethylene tetrafluoroethylene copolymer films are marketed by Asahi Glass Co., Ltd. under the trade name of AFLON COP, and by Daikin Industries, Ltd. under the trade name of NEOFLON ETFE. Tetrafluoroethylene-hexafluoropropylene copolymer films are marketed by Mitsui.DuPont Fluorochemicals Co., Ltd. under the trade name of TEFLON FEP, and by Daikin Industries, Ltd. under the trade name of NEOFLON FEP. Tetrafluoroethylene-perfluoroalkyl vinyl ether copolymer films are marketed by Mitsui.DuPont Fluorochemicals Co., Ltd. under the trade name of TEFLON PFA, and by Daikin Industries, Ltd. under the trade name of NEOFLON PFA. Liquid crystalline polymer films are marketed by Kuraray, Co., Ltd. under the trade name of VECTRAN. Porous polytetrafluoroethylene films are marketed by Sumitomo Electric Industries, Ltd. under the trade name of POREFLON, and by Japan Goatex Co., Ltd. under the trade name of GOATEX.

Each of the adhesive layers on both sides of the core material may be formed by dissolving or dispersing the components of the adhesive in a solvent to prepare a varnish, applying the varnish onto a heat resistant thermoplastic film used as the core material and removing the solvent by heating, to form an adhesive layer on the heat resistant thermoplastic film. By conducting the process on both sides of the heat resistant thermoplastic film, an adhesive member wherein an adhesive layer is formed on each side of a core material can be produced. The surfaces of the adhesive layers on both sides preferably are protected with cover films to prevent blocking. The cover films are optional because, in cases where there is no possibility of blocking, it is preferable to use no cover films in view of economy.

Alternatively, the adhesive member wherein an adhesive layer is formed on each side of a core material can be produced by dissolving or dispersing the components of the adhesive in a solvent to form a varnish, applying the varnish onto a carrier film as described above, removing the solvent by heating to form an adhesive layer on the carrier film, and applying the adhesive layer onto each side of a core material. In this case, the carrier film can be used as a cover film.

As for the adhesive member consisting of a film-form adhesive is, the adhesive layer formed on each side of the core material preferably has generated 10 to 40% of heat to be generated by complete curing thereof as measured by DSC.

The cured product of the adhesive of the present invention preferably has a storage modulus of as low as 20 to 2,000 MPa at 25° C., and 3 to 50 MPa at 260° C., as measured with a dynamic viscoelasticity measuring apparatus. Herein, the measurement of the storage modulus was conducted in a temperature dependent measuring mode on the cured product of an adhesive applied with a tension, at a frequency of 10 Hz, within a temperature range of −50° C. to 300° C. raised at a rate of 5 to 10° C./min. Cured products having a storage modulus of more than 2,000 MPa at 25° C. and more than 50 MPa at 260° C. are less effective in releasing the thermal stress resulting from the difference in coefficient of thermal expansion between a semiconductor chip and an interposer as an interconnecting substrate, and may cause peeling or cracking. Adhesives giving cured products having a storage modulus of less than 20 MPa at 25° C. may be difficult to handle and form adhesive layers lacking accuracy in thickness, and cured products having a storage modulus of less than 3 MPa at 260° C. may cause reflow cracking.

The interconnecting substrate for semiconductor mounting of the present invention comprises an interconnecting substrate and the adhesive member of the present invention stuck on the semiconductor chip-mounting surface of the interconnecting substrate.

The interconnecting substrate used in the interconnecting substrate for semiconductor mounting of the present invention is not limited in material, and, for example, may be a ceramic substrate or an organic substrate. Examples of usable ceramic substrates include alumina substrates and aluminum nitride substrates. Examples of usable organic substrates include FR-4 substrates comprising a glass cloth impregnated with an epoxy resin, BT substrates comprising glass cloth impregnated with a bismaleimide-triazine resin and polyimide film substrates wherein a polyimide film is used as a base material.

The interconnecting pattern may be of any one of a single-sided interconnecting line, a double-sided interconnecting line or a multilayered interconnecting line, and may optionally be provided with electrically connected through or non-through holes.

In cases where the interconnecting line is exposed on the outer surface of a semiconductor device, it preferably is coated with a protective resin layer.

According to a general but non-limitative method, the adhesive member is cut into a strip of a desired form, which is then stuck on a prescribed position of an interconnecting substrate with heat and pressure.

The semiconductor device of the present invention may have any structure, which contains a semiconductor chip and an interconnecting substrate bonded together by using the adhesive member of the present invention.

For example, the semiconductor device of the present invention may have a structure wherein the electrodes of the semiconductor chip and the interconnecting substrate are connected by wire bonding, or a structure wherein the electrodes of the semiconductor chip and the interconnecting substrate are connected by the inner lead bonding of tape automated bonding (TAB), and is effective irrespective of structure.

Figure 1:
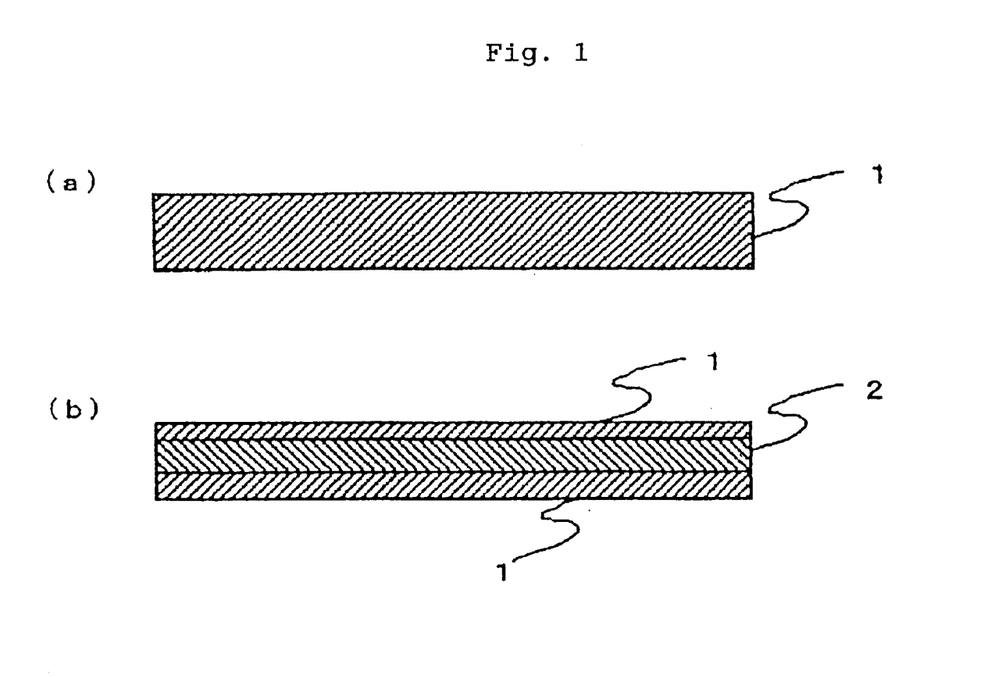
Figure 2:
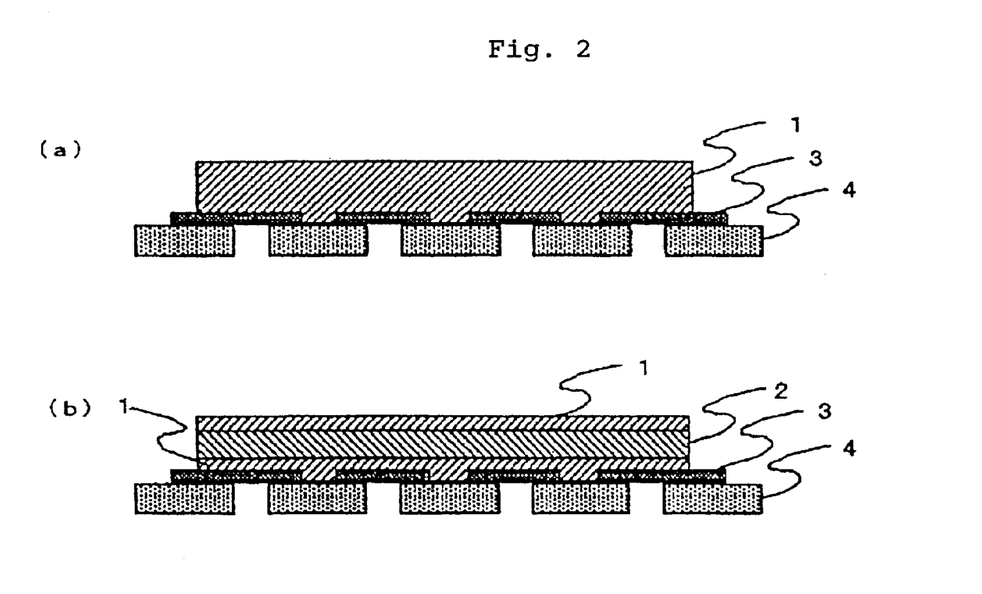
Figure 3:
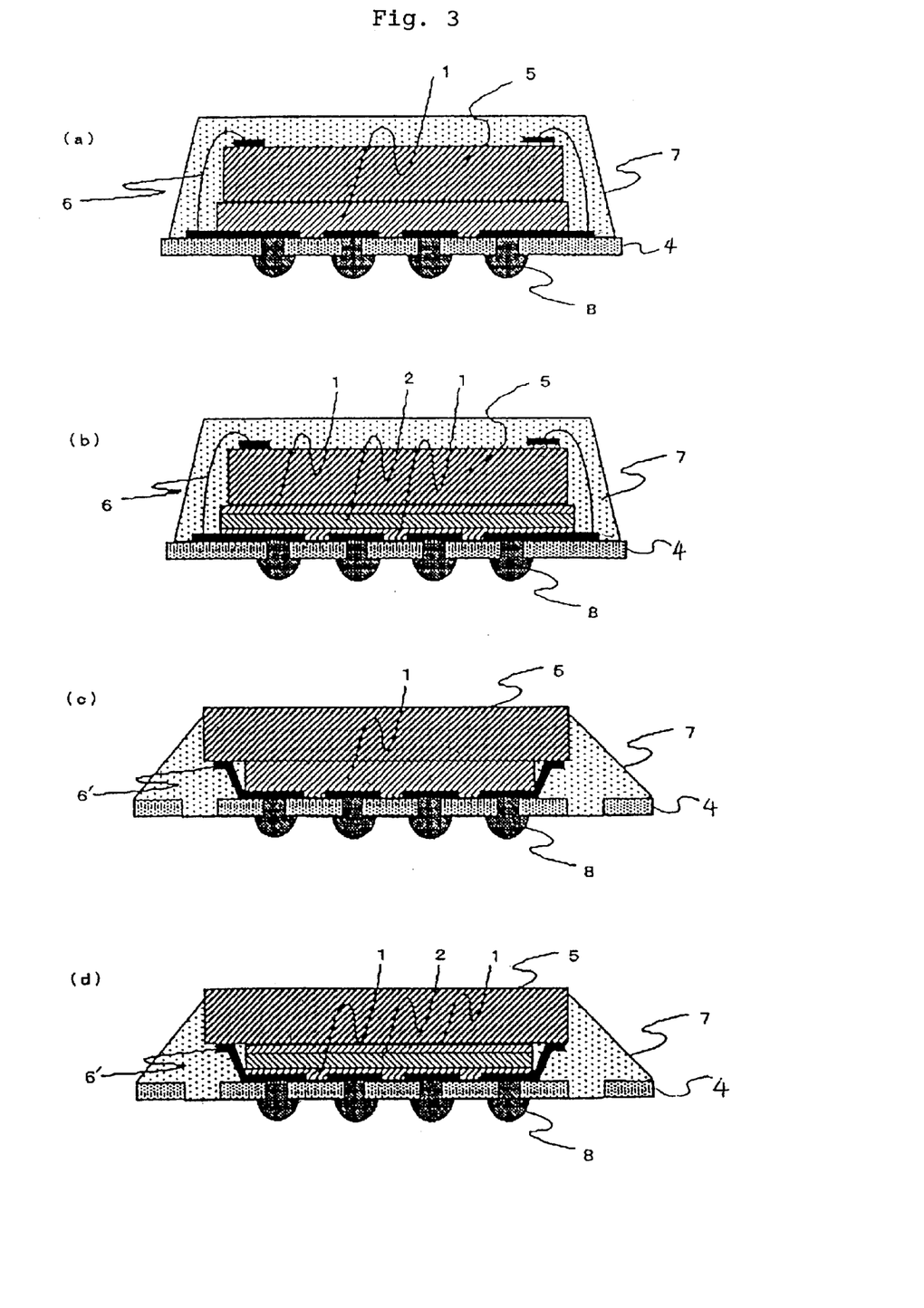

FIG. 1 to FIG. 3 show the processes for constructing non-limitative examples of the semiconductor devices of the present invention by using adhesive members.

The adhesive member may either be a film-form adhesive 1 as shown in FIG. 1(a) or comprise a core material 2 and a layer of an adhesive 1 provided on each side of the core material 2 as shown in FIG. 1(b). An adhesive member cut out into a prescribed size is stuck on an interconnecting substrate 4 as shown in FIG. 2(a) and FIG. 2(b) on the side bearing an interconnecting line 3 by heating and pressing, for example, at 100 to 150° C. at 0.01 to 3 MPa for 0.5 to 10 seconds, to give an adhesive member-bearing interconnecting substrate for semiconductor mounting. A semiconductor chip 5 is stuck on the other side of the adhesive member than the side stuck on the interconnecting substrate 4 by heating and pressing, for example, at 120 to 200° C. at 0.1 to 3 MPa for 1 to 10 seconds, and the layers of the adhesive 1 of the adhesive members are cured by heating at 150 to 200° C. for 0.5 to 2 hours. Thereafter, as shown in FIG. 3(a) and FIG. 3(b), the pads on the semiconductor chip 5 and the interconnecting line 3 on the interconnecting substrate 4 are connected by bonding wires 6, or, as shown in FIG. 3(c) and FIG. 3(d), the inner leads 6' of the interconnecting substrate 4 are bonded to the pads of the semiconductor chip 5. Then, sealing with a sealing material 7 and fixing of solder balls as leads for external connection 8 are carried out, to give a semiconductor device.

In the process described above, the temperature for sticking the adhesive member on the interconnecting substrate 4 on the side bearing the interconnecting line 3 is generally lower than the temperature for sticking the semiconductor chip 5.

Though a semiconductor chip and an interconnecting substrate which are similar in area generate a large thermal stress between them, the adhesive member for electronic parts used in the semiconductor device of the present invention has a low elastic modulus and releases the thermal stress, thereby ensuring reliability. Further the semiconductor device can be made flame-resistant by using a flame-resistant adhesive member. These effects are significant when the semiconductor chip has an area of 70% or more of the area of the interconnecting substrate. The areas of a semiconductor chip and an interconnecting substrate mean the areas of their surfaces facing each other. Such a semiconductor device containing a semiconductor chip and an interconnecting substrate having similar areas generally has leads for external connection of an area-form.

Semiconductor devices wherein a semiconductor chip and an interconnecting substrate were bonded by using the adhesive member of the present invention were excellent in reflow resistance, heat-cycle test and moisture resistance (resistance to PCT). Further, because the adhesive has a long usable period, semiconductor devices produced by using an adhesive that had been stored for three months at 25° C. and semiconductor devices produced by using a fresh adhesive exhibited substantially equal characteristics.

Herein, the weight average molecular weight is measured through gel permeation chromatography, based on the calibration curve of a standard, polystyrene.

EXAMPLES

Hereinafter, the present invention will be described in more detail referring to working examples.
(Preparation of Adhesive Varnish 1)
Methyl ethyl ketone was added to a composition comprising 45 parts by weight of a bisphenol A epoxy resin (epoxy equivalent weight: 175, trade name: YD-8125 produced by Tohto Kasei Co., Ltd.) and 15 parts by weight of a cresol novolac epoxy resin (epoxy equivalent weight: 210, trade name: YDCN-703 produced by Tohto Kasei Co., Ltd.) as epoxy resins, 40 parts by weight of a phenol novolac resin (trade name: PLYORPHEN LF 2882 produced by Dainippon Ink & Chemicals, Inc.) as a hardener for the epoxy resins, 220 parts by weight of an epoxidized acrylic rubber (molecular weight: 1,000,000, glycidyl methacrylate unit content: 1 wt. %, Tg: −70° C., trade name: HTR-860P-3 produced by Teikoku Kagaku Sangyo Co., Ltd.) as an epoxidized acrylic copolymer and 5 parts by weight of an amine-ureido adduct curing accelerator (trade name: FUJICURE FXR-1030 produced by Fuji Kasei Co., Ltd.) as a latent curing accelerator, mixed with stirring and degassed under vacuum. An adhesive film was produced by applying the resulting adhesive varnish onto a release-treated polyethyleneterephthalate film of 75 μm thick, and drying with heat at 140° C. for 5 minutes, to form a 80 μm-thick coating. After the adhesive film was cured by heating at 170° C. for one hour, its storage modulus was measured by using a dynamic viscoelasticity measuring apparatus (DVE-V4, produced by Rheology Co., Ltd.) (sample size: 20 mm long, 4 mm wide and 80 μm thick, heating rate: 5° C./min, tension mode, 10 Hz, automated static loading) to be 600 MPa at 25° C. and 5 MPa at 260° C. The adhesive varnish had a solid content of 32 wt. %. The adhesive varnish was adjusted to the solid content so that it had a viscosity of 100 poises (25° C.), because higher solid contents result in higher viscosities so that the thickness varies widely (the same reason applies correspondingly to the following).

(Preparation of Adhesive Varnish 2)

Adhesive varnish 2 was prepared in the same manner as in the preparation of adhesive varnish 1 except that the amine-ureido adduct curing accelerator as a latent curing accelerator was replaced by 5 parts by weight of an amine-epoxy adduct curing accelerator (trade name: AMICURE MY-24 produced by Ajinomoto Co., Inc.).

An adhesive film was produced by using adhesive varnish 2 in the same manner as in the preparation of adhesive varnish 1. The storage modulus of the adhesive film was measured by using a dynamic viscoelasticity measuring apparatus in the same manner as described above, to be 360 MPa at 25° C., and 4 MPa at 260° C. Adhesive varnish 2 had a solid content of 30 wt. %.

(Preparation of Adhesive Varnish 3)

Adhesive varnish 3 was prepared in the same manner as in the preparation of adhesive varnish 2 except that the amount of the amine-epoxy adduct curing accelerator as a latent curing accelerator was changed to 3 parts by weight.

An adhesive film was produced by using adhesive varnish 3 in the same manner as in the preparation of adhesive varnish 1 except that the temperature of the drying for forming a film was changed from 140° C. to 160° C. The storage modulus of the adhesive film was measured by using a dynamic viscoelasticity measuring apparatus in the same manner as described above, to be 360 MPa at 25° C., and 4 MPa at 260° C. Adhesive varnish 3 had a solid content of 28 wt. %.

(Preparation of Adhesive Varnish 4)

Adhesive varnish 4 was prepared in the same manner as in the preparation of adhesive varnish 2 except that the amount of the amine-epoxy adduct curing accelerator as a latent curing accelerator was changed to 10 parts by weight.

An adhesive film was produced by using adhesive varnish 4 in the same manner as in the preparation of adhesive varnish 1 except that the temperature of the drying for forming a film was changed from 140° C. to 120° C. The storage modulus of the adhesive film was measured by using a dynamic viscoelasticity measuring apparatus in the same manner as described above, to be 360 MPa at 25° C., and 4 MPa at 260° C. Adhesive varnish 4 had a solid content of 28 wt. %.

(Preparation of Adhesive Varnish 5)

Adhesive varnish 5 was prepared in the same manner as in the preparation of adhesive varnish 1 except that the amine-ureido adduct curing accelerator as a latent curing accelerator was replaced by 0.5 parts by weight of 2-phenylimidazole.

An adhesive film was produced by using adhesive varnish 5 in the same manner as in the preparation of adhesive varnish 1. The storage modulus of the adhesive film was measured by using a dynamic viscoelasticity measuring apparatus in the same manner as described above, to be 360 MPa at 25° C., and 4 MPa at 260° C. Adhesive varnish 5 had a solid content of 28 wt. %.

Example 1

An adhesive film bearing a carrier film was produced by applying adhesive varnish 1 onto a release-treated polyethyleneterephtalate film of 75 μm thick and drying with heat at 140° C. for 5 minutes to form a 75 μm-thick coating of a B-stage state. Two sheets of the adhesive film were stuck together by using a hot roll laminator at a temperature of 110° C., at a pressure of 0.3 MPa and at a rate of 0.3 m/min., to give an adhesive member in a form of a single-layer film of 150 μm thick.

The curing degree of the adhesive in the above-described state was determined by using a DSC (a 912-type DSC produced by E. I. DuPont de Nemours and Company) (heating rate: 10° C./min.) to be such that it had generated 20% of the heat to be generated by complete curing. The residual solvent content of the adhesive alone was determined to be 1.5 wt. % based on the change in weight before and after heating at 120° C. for 60 minutes.

Example 2

An adhesive member in a form of a single-layer film was produced in the same manner as in Example 1, except that adhesive varnish 1 was replaced by adhesive varnish 2.

The curing degree of the adhesive in the above-described state was determined by using a DSC (a 912-type DSC produced by E. I. DuPont de Nemours and Company) (heating rate: 10° C./min.) to be such that it had generated 20% of the heat to be generated by complete curing. The residual solvent content was 1.4 wt. %.

Example 3

Adhesive varnish 2 was applied onto a 25 μm-thick polyimide film (trade name: UPILEX SGA-25 produced Ube Industries, Ltd.) and dried with heat at 120° C. for 5 minutes to form a 50 μm-thick coating of a B-stage state. The same varnish was then applied onto the polyimide film on the side bearing no adhesive layer and dried with heat at 140° C. for 5 minutes to form a 70 μm-thick coating of a B-stage state, to give an adhesive member comprising the polyimide film used as a core material bearing an adhesive layer on each side.

The curing degree of the adhesive in the above-described state was determined by using a DSC (a 912-type DSC produced by E. I. DuPont de Nemours and Company) (heating rate: 10° C./min.) to be such that it had generated in the 50 μm-thick layer 25% of the heat to be generated by complete curing, and in the 75 μm-thick layer, 20%. The adhesive in both layers had residual solvent contents of 1.3 to 1.6 wt. %.

Example 4

An adhesive film bearing a carrier film was produced by applying adhesive varnish 2 onto a release-treated polyethyleneterephthalate film of 75 μm thick and drying with heat at 140° C. for 5 minutes to form a 75 μm-thick coating of a B-stage state. The adhesive film was stuck on both sides of a 25 μm-thick polyimide film (trade name: UPILEX SGA-25 produced by Ube Industries, Ltd.) by using a hot roll laminator at a temperature of 110° C., at a pressure of 0.3 MPa and at a rate of 0.2 m/min., to give an adhesive member comprising the polyimide film as a core material bearing an adhesive layer on each side.

The curing degree of the adhesive in the above-described state was determined by using a DSC (a 912-type DSC produced by E. I. DuPont de Nemours and Company) (heating rate: 10° C./min.) to be such that it had generated in both layers 20% of the heat to be generated by complete curing. The residual solvent content was 1.4 wt. %.

Example 5

An adhesive member comprising a liquid crystalline polymer film as a core material bearing an adhesive layer on each side was produced in the same manner as in Example 4, except that the polyimide film as a core material was replaced by a 25 μm-thick liquid crystalline polymer film (trade name: VECTRAN LCP-A produced by Kuraray, Co., Ltd.).

The curing degree of the adhesive in the above-described state was determined by using a DSC (a 912-type DSC produced by E. I. DuPont de Nemours and Company) (heating rate: 10° C./min.) to be such that it had generated in both layers 20% of the heat to be generated by complete curing. The residual solvent content was 1.4 wt. %.

Example 6

An adhesive member comprising a tetrafluoroethylene-hexafluoropropylene copolymer film bearing an adhesive layer on each side was produced in the same manner as in Example 4, except that the polyimide film as a core material was replaced by a 25 μm-thick tetrafluoroethylene-hexafluoropropylene copolymer film (trade name: TEFLON FEP produced by Mitsui.DuPont Fluorochemicals Co., Ltd.). The tetrafluoroethylene-hexafluoropropylene copolymer film used had both surfaces chemically treated with TETRAETCH (trade name, produced by Kabushiki Kaisha Junkosha) to increase adhesion by increasing wettability.

The curing degree of the adhesive in the above-described state was determined by using a DSC (a 912-type DSC produced by E. I. DuPont de Nemours and Company) (heating rate: 10° C./min.) to be such that it had generated in both layers 20% of the heat to be generated by complete curing. The residual solvent content was 1.5 wt. %.

Example 7

An adhesive member of a single-layer film form bearing a carrier film was produced by applying adhesive varnish 2 onto a release-treated polyethyleneterephthalate film of 75 μm thick and drying with heat at 140° C. for 5 minutes to form a 60 μm-thick coating of a B-stage state. The single-layer film was stuck on both sides of a 100 μm-thick porous polytetrafluoroethylene film (trade name: WP-100-100 produced by Sumitomo Electric Industries, Ltd.) by using a hot roll laminator at a temperature of 110° C., at a pressure of 0.3 MPa and at a rate of 0.2 m/min., to give an adhesive member comprising the porous polytetrafluoroethylene film as a core material bearing an adhesive layer on each side.

The curing degree of the adhesive in the above-described state was determined by using a DSC (a 912-type DSC produced by E. I. DuPont de Nemours and Company) (heating rate: 10° C./min.) to be such that it had generated in both layers 20% of the heat to be generated by complete curing. The residual solvent content was 1.4 wt. %.

Example 8

An adhesive member of a single-layer film form was produced in the same manner as in Example 1, except that adhesive varnish 1 was replaced by adhesive varnish 3, and the temperature of the drying for forming a film was changed from 140° C. to 160° C.

The curing degree of the adhesive in the above-described state was determined by using a DSC (a 912-type DSC produced by E. I. DuPont de Nemours and Company) (heating rate: 10° C./min.) to be such that it had generated 20% of the heat to be generated by complete curing.

Example 9

An adhesive member of a single-layer film form was produced in the same manner as in Example 1, except that adhesive varnish 1 was replaced by adhesive varnish 4, and the temperature of the drying for forming a film was changed from 140° C. to 120° C.

The curing degree of the adhesive in the above-described state was determined by using a DSC (a 912-type DSC produced by E. I. DuPont de Nemours and Company) (heating rate: 10° C./min.) to be such that it had generated 20% of the heat to be generated by complete curing.

Reference Example 1

An adhesive member of a single-layer film form was produced in the same manner as in Example 1, except that adhesive varnish 1 was replaced by adhesive varnish 5.

The curing degree of the adhesive in the above-described state was determined by using a DSC (a 912-type DSC produced by E. I. DuPont de Nemours and Company) (heating rate: 10° C./min.) to be such that it had generated 20% of the heat to be generated by complete curing.

By using the obtained adhesive members, semiconductor device samples (solder balls were formed on one side) as shown in FIG. 3(c) and FIG. 3(d) were produced by sticking with an adhesive member a semiconductor chip on an interconnecting substrate the base material of which was a 25 μm-thick polyimide film (sticking conditions: temperature: 160° C., pressure: 1.5 MPa, time: 3 seconds), and were examined for heat resistance, flame-resistance, moisture resistance and foaming. The heat resistance was evaluated by reflow cracking resistance and a thermal cycle test. The reflow cracking resistance was evaluated by subjecting twice the samples to a treatment wherein they were passed through an IR reflow furnace heated to keep the surface temperature of the samples to 240° C. for 20 seconds and cooled by allowing them to stand at room temperature, and then observing the inside of the samples for cracks visually and with an ultrasonic microscope. The mark ○ means a sample not cracked, and X means a sample cracked. The resistance to thermal cycles was evaluated by allowing the samples to stand in an atmosphere of −55° C. for 30 minutes and then allowing them to stand in an atmosphere of 125° C. for 30 minutes in one cycle. After 1,000 cycles, the samples were observed with an ultrasonic microscope, and rated as ○ when breakage, such as peeling or cracks, was not observed, and as X when breakage was observed. The moisture resistant was evaluated by observing the samples for peeling after the samples were treated for 72 hours in an atmosphere of a temperature of 121° C., a humidity of 100% and 2 atm (pressure cooker test, PCT treatment). The mark ○ means a sample wherein the peeling of the bonding member was not observed, and X means a sample wherein the peeling was observed. Foaming was observed with an ultrasonic microscope, and samples wherein the adhesive members did not foam were rated as ○, and those wherein the adhesive members foamed as X. The usable period was evaluated by producing semiconductor devices of the same types by using the adhesive members after they were stored at 25° C. for 3 months, and observing the adhesives filling circuits with an ultrasonic microscope. The samples wherein no vacant space was observed between the adhesives and the interconnecting lines were rated as ○, and those wherein such vacant spaces were observed were rated as X. The results are given in Table 1.

TABLE 1

Result of Evaluation

| | Example Nos. | | | | |
|---|---|---|---|---|---|
| | 1 | 2 | 3 | 4 | 5 |
| Heat resistance | | | | | |
| Reflow crack resistance | ○ | ○ | ○ | ○ | ○ |
| Thermal cycle resistance | ○ | ○ | ○ | ○ | ○ |
| Moisture resistance | ○ | ○ | ○ | ○ | ○ |
| Foaming | X | ○ | ○ | ○ | ○ |
| Usable period | ○ | ○ | ○ | ○ | ○ |

| | Example Nos. | | | | Ref. Ex. |
|---|---|---|---|---|---|
| | 6 | 7 | 8 | 9 | No. 1 |
| Heat resistance | | | | | |
| Reflow crack resistance | ○ | ○ | ○ | ○ | ○ |
| Thermal cycle resistance | ○ | ○ | ○ | ○ | ○ |
| Moisture resistance | ○ | ○ | ○ | ○ | ○ |
| Foaming | ○ | ○ | ○ | ○ | ○ |
| Usable period | ○ | ○ | ○ | ○ | X |

In Example 1 wherein an amine-ureido adduct latent curing accelerator was used, the usable period was long, but foaming occurred on curing. In Examples 2 to 9 wherein an amine-epoxy adduct latent curing accelerator was used, good results of a long usable period and no foaming on curing were obtained. In these Examples, the curing products of adhesives had the preferred storage modulus at 25° C. and 260° C. as specified in the present invention, and the semiconductor devices using the adhesive members exhibited good results in reflow crack resistance, thermal cycle resistance and moisture resistance. The adhesive members used in Examples 3 to 7, which had core materials, had good processability.

In Reference Example 1 wherein an imidazole having no adduct was used as a curing accelerator, the usable period was short.

Example 10

Methyl ethyl ketone was added to a composition comprising 45 parts by weight of a bisphenol A epoxy resin (epoxy equivalent weight: 190, trade name: EPIKOTE 828 produced by Yuka Shell Epoxy Co., Ltd.) and 15 parts by weight of a cresol novolac epoxy resin (epoxy equivalent weight: 195, trade name: ESCN 195 produced by Sumitomo Chemical Co., Ltd.) as epoxy resins, 40 parts by weight of a phenol novolac resin (trade name: PLYORPHEN LF2882 produced by Dainippon Ink & Chemicals, Inc.) as a hardener for the epoxy resins and 0.7 parts by weight of γ-glycidoxypropyltrimethoxysilane (trade name: NUCA-187 produced by Nippon Yunicar Kabushiki Kaisha) as a silane coupling agent and mixed with stirring. To the mixture were added 150 parts by weight of an epoxidized acrylic copolymer having a glycidyl methacrylate or glycidyl acrylate unit content of 2 to 6 wt. % (weight average molecular weight: 1,000,000, trade name: HTR-860P-3 produced by Teikoku Kagaku Sangyo Co., Ltd.) and 4 parts by weight of an amine-epoxy adduct (trade name: AMICURE MY-24 produced by Ajinomoto Co., Inc.) as a curing accelerator, and the mixture was stirred with an agitating motor for 30 minutes, to obtain a varnish. A 75 μm-thick coating of a B-stage state was formed from the varnish, to produce an adhesive film bearing a carrier film (a release treated polyethyleneterephthalate film, thickness: 75 μm) (drying conditions: temperature: 140° C., time: 5 minutes). In the adhesive of the B-stage state, AMICURE MY-24 was dissolved uniformly in the mixture of the epoxy resins and hardener, but was not dissolved in the acrylic rubber and was deposited as particles. After the complete curing of the adhesive, the epoxy resins and the acrylic rubber were separated into a disperse phase and a continuous phase, respectively.

Example 11

An adhesive film bearing a carrier film was produced in the same manner as in Example 10, except that the curing accelerator was replaced by FUJICURE FXR-1030 produced by Fuji Kasei Co., Ltd. that is an amine-ureido adduct compound. In the adhesive of the B-stage state, FUJICURE FXR-1030 was dissolved uniformly in the mixture of the epoxy resins and hardener, but was not dissolved in the acrylic rubber and was deposited as particles.

Reference Example 2

An adhesive film bearing a carrier film was produced in the same manner as in Example 10, except that the curing accelerator was replaced by 0.5 parts by weight of 1-cyanoethyl-2-phenylimidazole (trade name: CURESOLE 2PZ-CN produced by Shikoku Kasei Kogyo Co., Ltd.). In the adhesive of the B-stage state, CURESOLE 2PZ-CN was dissolved in both the epoxy resins and the acrylic rubber.

Usable periods were evaluated by sticking a semiconductor chip on an interconnecting substrate the base material of which was a 25 μm-thick polyimide film with each of the obtained adhesive members after they had been stored at 25° C. for 1 to 6 months (sticking conditions: temperature: 160° C., pressure: 1.5 MPa, time: 3 seconds), and observing the adhesives for filling ability in the interconnecting lines with an ultrasonic microscope. The adhesives that left no vacant spaces between them and the interconnecting lines on the interconnecting substrates were rated as ○, and those that left vacant spaces as X. The results are given in Table 2.

TABLE 2

Result of Evaluation

| | Example 10 | Example 11 | Reference Example 2 |
|---|---|---|---|
| Filling ability | | | |
| Initial stage | ○ | ○ | ○ |
| 1 month | ○ | ○ | ○ |

TABLE 2-continued

| | Result of Evaluation | | |
|---|---|---|---|
| | Example 10 | Example 11 | Reference Example 2 |
| 2 months | ○ | ○ | X |
| 3 months | ○ | ○ | X |
| 4 months | ○ | ○ | X |
| 5 months | X | X | X |
| 6 months | X | X | X |
| Usable period | 4 months | 4 months | 1 month |

In Example 10 wherein an amine-epoxy adduct latent curing accelerator was used, a good result of a long usable period was obtained. In Example 11 wherein an amine-ureido adduct latent curing accelerator was used, a good result of a long usable period was obtained. The usable period was short in Reference Example 2 wherein the curing accelerator used was an imidazole that has a low molecular weight and is soluble in both the rubber and the epoxy resins.

INDUSTRIAL APPLICABILITY

The adhesive A of the present invention is improved in the storage stability of its B-stage film by the use of a latent curing accelerator. The adhesives containing amine adducts, MY-24 and FXR-1030, excelled in heat resistance and moisture resistance. Particularly, at the time of curing, adhesives containing the amine-epoxy adduct latent curing accelerator could be cured fast enough to give completely cured products without foaming. Among the adhesive members of the present invention, those containing adduct, particularly amine adduct, more particularly amine-epoxy adduct latent curing accelerators particularly excel in heat resistance and moisture resistance. Because of such effects, the present invention can efficiently provide adhesive members necessary for semiconductor devices to exhibit high reliability.

The adhesive film made from the adhesive B of the present invention is significantly advantageous compared with conventional adhesive films because it has a long usable period, can be stored for a long period and is easy of production control. That is, the adhesive and the adhesive film have excellent storage stability. By using the adhesive of claim 12 that, in a B-state state, forms a disperse phase containing an epoxy resin and a hardener as main components and a continuous phase containing a high molecular weight component having a weight average molecular weight of 100,000 or more, an adhesive film excelling further in adhesion, heat resistance and film processability can be produced. In particular, an adhesive containing as the high molecular weight component resin forming the continuous phase an epoxidized acrylic copolymer having a glycidyl (meth)acrylate copolymer unit content of 2 to 6 wt. % is advantageous because it can form an adhesive film having higher adhesion and better heat resistance. The use of an amine-epoxy adduct compound as a curing accelerator can provide an adhesive that is further excellent in that it does not foam on curing and forms an adhesive film having low elasticity and good heat resistance and moisture resistance. Thus, the present invention can provide adhesive films, interconnecting substrates for semiconductor mounting and semiconductor devices, which exhibit particularly high storage stability.

What is claimed is:

1. An adhesive, which is an adhesive composition comprising two kinds of resins which when the composition is in a B-stage state, separate from each other into a disperse phase and a continuous phase, a hardener and a curing accelerator, wherein in the B-stage state, the curing accelerator is compatible with the disperse phase and separates from the continuous phase, the B-stage state being a state wherein, as measured by using differential scanning thermal analysis, 10–40% of heat to be generated by complete curing of the adhesive composition has been generated.

2. The adhesive of claim 1, wherein in the B-stage state, the disperse phase contains an epoxy resin and the hardener as main components, and the continuous phase contains as a main component a high molecular weight component having a weight average molecular weight of 100,000 or more.

3. The adhesive of claim 2, wherein the high molecular weight component having a weight average molecular weight of 100,000 or more is an epoxidized acrylic copolymer having a glycidyl methacrylate unit content or a glycidyl acrylate unit content of 2 to 6 wt. %.

4. The adhesive of claim 1, wherein the curing accelerator is an amine-epoxy adduct.

5. An adhesive member of a film form, comprising a carrier film and a layer of the adhesive of claim 1 formed on the carrier film.

6. An adhesive member, comprising a core material and a layer of the adhesive of claim 1 formed on each side of the core material.

7. The adhesive member of claim 6, wherein the core material is a heat resistant thermoplastic film.

8. The adhesive member of claim 7, wherein the heat resistant thermoplastic film has a softening temperature of 260° C. or higher.

9. The adhesive member of claim 7, wherein the heat resistant thermoplastic film is a porous film.

10. The adhesive member of claim 7, wherein the heat resistant thermoplastic film is a liquid crystalline polymer.

11. The adhesive member of claim 7, wherein the heat resistant thermoplastic film is a polyamideimide, a polyimide, a polyetherimide or a polyether sulfone.

12. The adhesive member of claim 7, wherein the heat resistant thermoplastic film is a polytetrafluoroethylene, an ethylene-tetrafluoroethylene copolymer, a tetrafluoroethylene-hexafluoropropylene copolymer or a tetrafluoroethylene-perfluoroalkyl vinyl ether copolymer.

13. An interconnecting substrate for semiconductor mounting, comprising:
   an interconnecting substrate having a semiconductor chip mounting surface and
   the adhesive member of claim 5 stuck on the semiconductor chip-mounting surface of the interconnecting substrate.

14. A semiconductor device, comprising a semiconductor chip and an interconnecting substrate bonded together by using the adhesive member of claim 5.

15. A semiconductor device, comprising an interconnecting substrate and a semiconductor chip having an area of 70% or more of an area of the interconnecting substrate, the interconnecting substrate and the semiconductor chip being bonded together by using the adhesive member of claim 5.

16. An interconnecting substrate for semiconductor mounting, comprising:
   an interconnecting substrate having a semiconductor chip mounting surface, and
   the adhesive member of claim 6 stuck on the semiconductor chip mounting surface of the interconnecting substrate.

17. A semiconductor device, comprising a semiconductor chip and an interconnecting substrate bonded together by the adhesive member of claim 6.

18. A semiconductor device, comprising an interconnecting substrate and a semiconductor chip having an area of 70% or more of an area of the interconnecting substrate, the interconnecting substrate and the semiconductor chip being bonded together by the adhesive member of claim 6.

19. The adhesive of claim 1, wherein the kind of resin which, when the composition is in said B-stage state, is in said disperse phase, is an epoxy resin.

20. The adhesive of claim 1, wherein the resin forming the continuous phase in said B-stage state is 20–85 wt. % of the total of the resins forming the disperse phase and the continuous phase.

21. The adhesive of claim 1, wherein the amount of the curing accelerator in the adhesive composition is 0.1 to 20 parts by weight to 100 parts by weight of a total of the resin and hardener in the disperse phase.

22. The adhesive of claim 1, wherein the resin in the disperse phase is an epoxy resin and the resin in the continuous phase is an acrylic rubber, and the curing accelerator is an adduct of an epoxide and an imidazole or an adduct of an epoxide and a dialkylamine.

23. The adhesive of claim 1, wherein said curing accelerator is selected from the group consisting of amine-epoxy adducts, amine-ureido adducts and amine-urethane adducts.

* * * * *